(12) United States Patent
Ogawa

(10) Patent No.: US 7,407,832 B2
(45) Date of Patent: Aug. 5, 2008

(54) METHOD FOR MANUFACTURING SEMICONDUCTOR PACKAGE

(75) Inventor: Yasuki Ogawa, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 49 days.

(21) Appl. No.: 11/505,920

(22) Filed: Aug. 18, 2006

(65) Prior Publication Data

US 2007/0059860 A1 Mar. 15, 2007

(30) Foreign Application Priority Data

Sep. 12, 2005 (JP) ............................. 2005-263516

(51) Int. Cl.
*H01L 21/44* (2006.01)
(52) U.S. Cl. .................. 438/106; 438/112; 438/124; 438/127; 257/E21.504; 257/E23.125; 156/500; 249/95; 425/116
(58) Field of Classification Search ................. 438/106, 438/112, 124, 127; 257/E21.504, E23.125; 156/500; 249/95; 425/116
See application file for complete search history.

(56) References Cited

U.S. PATENT DOCUMENTS 5,663,104 A * 9/1997 Fukuyama ............. 438/123

5,817,208 A * 10/1998 Nose et al. ............. 156/500
5,874,324 A * 2/1999 Osada ...................... 438/124
6,276,913 B1 * 8/2001 Mitsui et al. ............. 425/116
6,430,034 B2 * 8/2002 Sano et al. ............... 361/528

FOREIGN PATENT DOCUMENTS

JP 11-087565 3/1999
JP 2001-160604 6/2001

OTHER PUBLICATIONS

The Nikkan Kogyo Shinbun, Ltd., 1989, "Handbook of Die and Mold Technology", Japanese Society of Die and Mould Technology, ed.

* cited by examiner

*Primary Examiner*—Andy Huynh
(74) *Attorney, Agent, or Firm*—Volentine & Whitt, P.L.L.C.

(57) ABSTRACT

A die for encapsulating an IC structural body having bonding wires with a molten resin is provided with at least one first half having an ejector-pin-through-hole and at least one second half coupled together to form a cavity therebetween. An ejector pin having a mirror-finished surface at a tip end thereof is inserted into the ejector-pin-through-hole and positioned at a position where a surface of the tip end of the ejector pin coincides with an intermediate surface height of a satin-finished surface formed on an upper inner wall of the cavity of the first half. The IC structural body is then encapsulated with a molten resin, and the mirror-finished surface of the ejector pin and the satin-finished surface of the upper inner wall surface of the cavity are stamped on the semiconductor package in substantially the same plane.

12 Claims, 7 Drawing Sheets

METHOD FOR MANUFACTURING SEMICONDUCTOR PACKAGE

BACKGROUND OF THE INVENTION

1. Field of the Invention

The present invention relates to a method for manufacturing a semiconductor package, and in particular, relates to a method for manufacturing a semiconductor package while using a die having an ejector pin, the semiconductor package having a mirror-finished surface encircled by a satin-finished surface.

2. Description of the Related Art

A typical semiconductor package is formed by embedding an IC structural. body having a lead, an IC chip, and bonding wires bonding between the lead and the IC chip within a resin bulk while using a die.

A surface of the die, as its normal appearance, is generally a satin-finished surface for the sake of easy exfoliation.

In such a prior art that is disclosed by "Nakagawa et al., Kata-Gijyutu-Binran, Nikkan-Kogyo-Shimbun, 1989, p. 88-95", a circular and concave imprint formed by an ejector pin, which is a mirror-finished surface, is used as an indicator of a "1-pin" for recognition of a first pin. The ejector pin is arranged in the die during a process of resin-encapsulation to readily release the semiconductor package from a die after the resin-encapsulation. When the ejector pin moves, an imprint of the ejector pin is formed on the satin-finished surface of the semiconductor package.

When plural imprints are formed, the "1-pin" is formed while having specific shape and appearance which are distinguishable from imprints of the other pins.

Japanese Patent Kokai 11-87565 (document D1) discloses another method for forming an indication portion of the "1-pin" on a package surface. In this method, a portion corresponding to the indication portion is made at a step of forming a satin-finished surface on the die by finishing the surface excluding a masked portion with plasma-etching etc.

After encapsulation of the IC structural body with a resin, a mark representing a product name, etc. is stamped on a surface of the semiconductor package released from the die as disclosed by a Japanese Patent Kokai 2001-160604 (document D2). As for the method for stamping a mark on the package surface, the mark is formed by a laser beam in view of its fast processing speed.

Recently, in a resin-encapsulation-type semiconductor package, in particular, a semiconductor package for an IC card, a thin thickness and a compactness are required, so that a resin layer covering the semiconductor package is made thinner.

It is, on the other hand to, be understood that the above-mentioned imprint of ejector pin influences an installment height of the semiconductor product, the imprint can not be formed as convex and is normally formed as concave.

For this reason, as a thickness of manufactured semiconductor package decreases, it is difficult to keep a space between the concave portion of the imprint of ejector pin and the bonding wires in the semiconductor package. There arises a problem that the bonding wires are subject to be exposed to the outside during the resin-encapsulation.

The laser stamping is typically performed by etching a resin surface of tens micrometers. When a thickness of the resin surface of semiconductor package is much thin, a depth of the mark to be formed by the laser beam can not be disregarded. There arises another problem that an IC structural body such as bonding wires etc. is exposed to the outside by way of etching the resin surface during resin-encapsulation and that a resin wall cracks at the laser stamped portion because of an external pressure.

In addition, a mirror-finished surface of a die is likely to be deteriorated much more than a satin-finished surface of the die, so that the mirror-finished surface is deteriorated earlier when the die is used repeatedly. In the die disclosed by document D1, a mirror-finished surface used for indicating directly the "1-pin" position is formed on an upper inner wall surface of the cavity which is a satin-finished surface. When the mirror-finished surface is deteriorated, it is required to replace one or all parts of die for new one even though the portion of satin-finished surface is not deteriorated. As a result, there arises another problem that mass-production of semiconductor package causes to raise costs for the die.

SUMMARY OF THE INVENTION

An object of the present invention is to provide a method for manufacturing a semiconductor package that can reduce a possibility that bonding wires are exposed from a semiconductor package surface to the outside. According to a first aspect of the present invention, there is provided a method, which includes first to third steps, for manufacturing a semiconductor package having a mirror-finished surface for indicating a "1-pin" position.

In the first step, a die is prepared which includes at least one first half and at least one second half coupled together to form a cavity therebetween. The first half has a satin-finished inner surface and an ejector-pin-through-hole extending therethrough.

In the second step, an ejector pin having a mirror-finished surface at a tip end thereof is inserted into the ejector-pin-through-hole and positioned at a position where a surface of the tip end of the ejector pin coincides with an intermediate surface height of the satin-finished inner surface of the first half.

In the third step, an IC structural body having bonding wires which bond between an IC chip and a lead is embedded within a molten resin filled in the cavity between the first half and second half after the IC structural body is confined within the cavity.

In the second step according to the first aspect of the present invention, the ejector pin is inserted into the ejector-pin-through-hole and positioned at a position where the surface of the tip end of the ejector pin coincides with the intermediate surface height of the satin-finished inner surface of the first half, so that the mirror-finished surface for indicating the "1-pin" position is defined by the satin-finished inner surface and is formed at the same plane as the intermediate surface height of the satin-finished inner surface. Thus, the semiconductor package manufactured by the method according to the first aspect of the present invention can keep a larger space between the bonding wires and the indication portion of the "1-pin" position of the semiconductor package surface more surely than a semiconductor package manufactured by the conventional method can. Therefore, the above-mentioned possibility that the bonding wires are exposed from the semiconductor package surface to the outside can be reduced even when semiconductor packages of a thin thickness and a compactness are manufactured.

Another object of the present invention is to provide a method for manufacturing a semiconductor package that has less possibilities that an IC structural body including bonding wires etc. is exposed from a semiconductor package surface to the outside and that a resin wall cracks at a stamped portion because of an external pressure.

According to a second aspect of the present invention, there is provided a method, which includes first to fourth steps, for manufacturing a semiconductor package having a mark-shaped and mirror-finished surface thereon.

In the first step, a die is prepared which includes at least one first half and at least one second half coupled together to form a cavity therebetween. The first half has an ejector-pin-through-hole extending therethrough.

In the second step, an ejector pin having a mark-shaped and mirror-finished surface at a tip end thereof is inserted into the ejector-pin-through-hole and positioned at a position where a surface of the tip end of the ejector pin coincides with an inner surface of the first half.

In the third step, a satin-finished surface is formed only on the inner surface of the first half while the tip end of the ejector pin is masked.

In the fourth step, an IC structural body having bonding wires which bond between an IC chip and a lead is embedded within a molten resin filled in the cavity after the IC structural body is confined within the cavity.

In the second step according to the second aspect of the present invention, the ejector pin having a mirror-finished surface at the tip end is inserted into the ejector-pin-through-hole and positioned at a position where the surface of the tip end of the ejector pin coincides with the inner surface of the first half, so that the mark shaped and mirror-finished surface and the satin-finished inner surface are formed on the semiconductor package surface at the same plane in the third step. Thus, the semiconductor package according to the second aspect of the present invention can surely keep a large space between the IC structural body in the package and the indication of the "1-pin" position on the semiconductor package in comparison with a semiconductor package manufactured by the conventional method. Thereby, the above-mentioned possibilities can be reduced that the IC structural body is exposed from the semiconductor package surface to the outside and that a resin wall cracks at the stamped portion because of an external pressure.

DETAILED DESCRIPTION OF THE INVENTION

Figure 1:
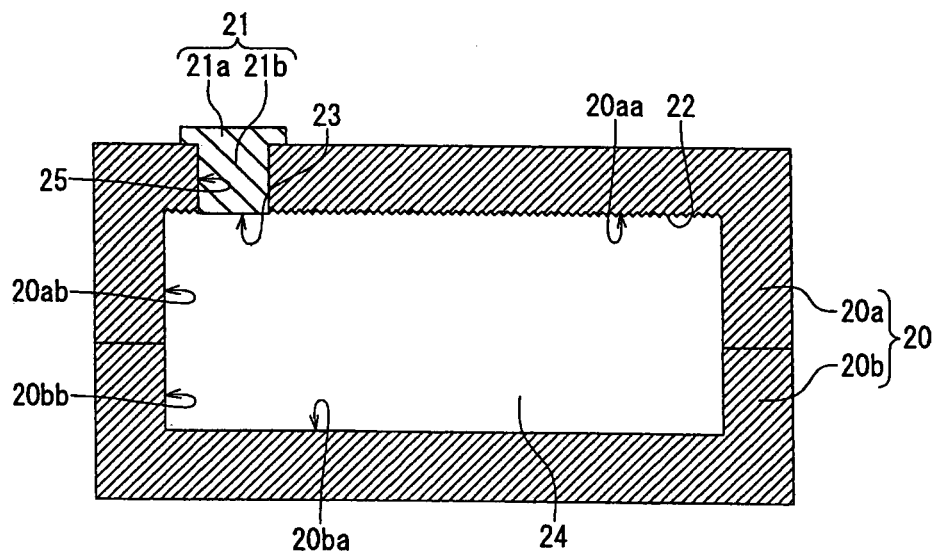
FIG. 1 is a cross-sectional view showing a die prepared at a first step according to a first embodiment of the present invention.
Figure 2:
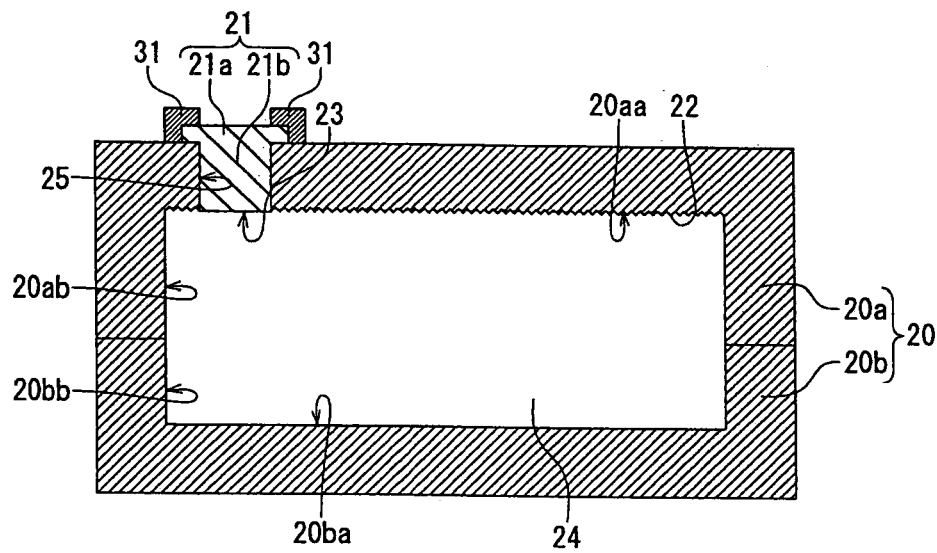
FIG. 2 is a cross-sectional view showing the die at a second step according to the first embodiment of the present invention.
Figure 3:
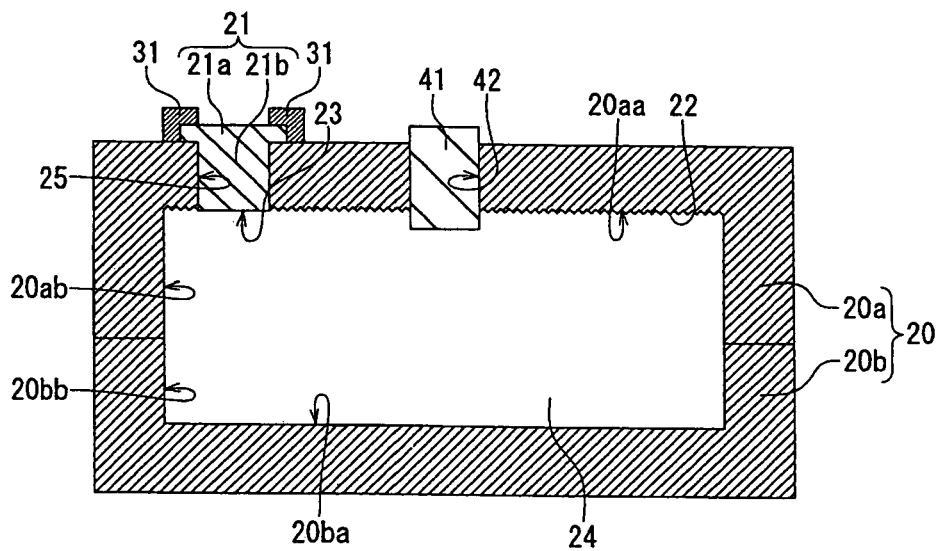
FIG. 3 is a cross-sectional view showing the die with a spare pin inserted therein according to the first embodiment of the present invention.
Figure 4:
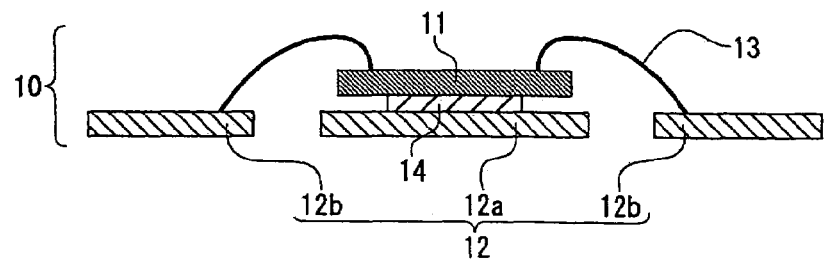
FIG. 4 is a cross-sectional view showing an IC structural body according to the first embodiment of the present invention and according to a second embodiment of the invention.
Figure 5:
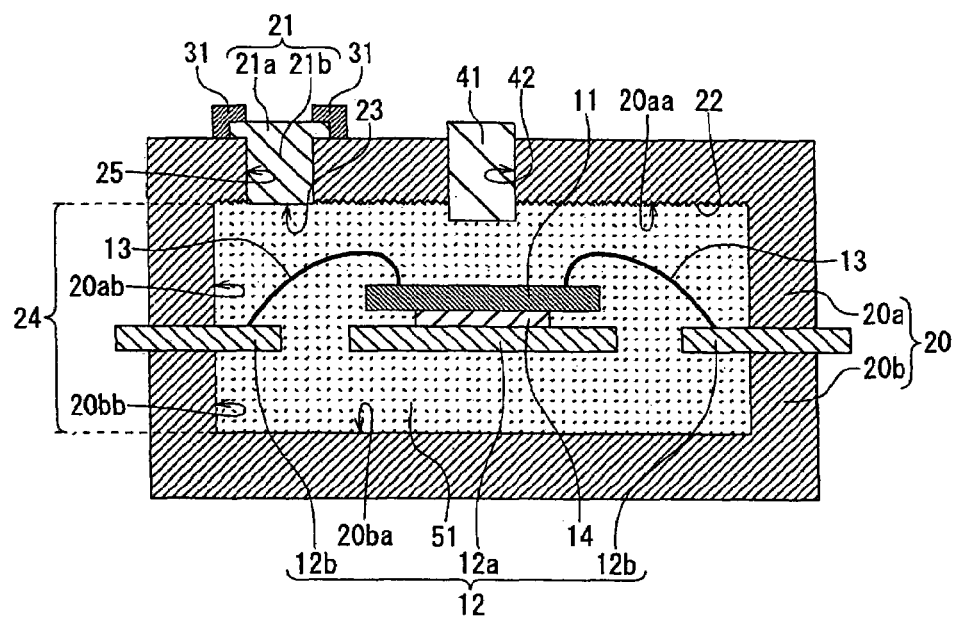
FIG. 5 is a cross-sectional view showing the IC structural body and the die during resin-encapsulation according to the first embodiment of the invention.

In a first embodiment of the present invention, a method for manufacturing a semiconductor package having a mirror-finished surface encircled by a satin-finished inner surface for indicating a "1-pin" position includes first to fourth steps mentioned hereinbelow. The respective steps will be described in sequence starting from the first step, as follows:

FIGS. 1 to 3 are cross-sectional views showing a die used in the first to the second steps according to the first embodiment of the present invention. FIG. 4 is a cross-sectional view showing an IC structural body at the third step according to the first embodiment of the present invention. FIG. 5 is a cross-sectional view showing an IC structural body and a die during resin-encapsulation at the third step according to the first embodiment of the present invention.

In the first step according to the first embodiment of the invention, a die 20 is prepared which includes a first half 20a and a second half 20b coupled together to form a cavity 24 therebetween. It should be noted that the first half 20a and the second half 20b are one or more respectively. The first half 20a has a satin-finished inner surface 22 and an ejector-pin-through-hole 25 extending therethrough, as shown in FIG. 1. It should be noted that the die 20 shown in FIG. 1 is shown as an integrated combination of the first half 20a, the second half 20b and an ejector pin 21. The die 20 itself consists of the first half 20a and the second half 20b. The first half 20a and the second half 20b, each having an approximate reentrant cross-section and mutually confronting, are provided with an upper inner wall surface of cavity 20aa, an inner flat plane of second half 20ba, an inner side wall surface of first half 20ab, and an inner side wall of second half 20bb to form the cavity 24. An IC structural body 10 and a molten resin for encapsulation are confined within the cavity 24 which is formed by coupling the first half 20a and the second half 20b. The satin-finished inner surface 22 is formed on the upper inner wall surface of cavity 20aa of cavity. No a satin-finished inner surface is formed on the inner wall surface of first half 20ab, the inner wall surface of second half 20bb, and an inner flat plane of second half 20ba. However, a satin-finished inner surface may be formed at a portion other than the upper. inner wall surface of cavity 20aa.

In the second step according to the first embodiment of the present invention, the ejector pin 21 having a mirror finished surface 23 at a tip end is inserted into the ejector-pin-through-hole 25 of the first half 20a prepared in the first step and positioned at a position where a surface of a tip end of the ejector pin coincides with an intermediate surface height of the satin-finished inner surface 22 of the first half 20a as shown in FIG. 2.

Figure 14:
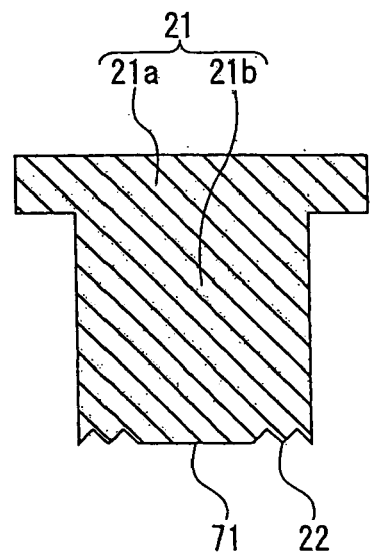
FIG. 14 is a cross-sectional view showing an ejector pin prepared at the first step according to the second embodiment of the invention.

The ejector pin 21 is inserted into the ejector-pin-through-hole 25 of the first half 20a so as to be exposed to the cavity 24. The ejector pin 21 is inserted from the outside of the first half 20a into the cavity 24 passing through the ejector-pin-through-hole 25 provided in the first half 20a. It should be noted that the ejector pin 21 of the present invention has a shape different from the conventional ejector pin. As shown in FIG. 14, the ejector pin 21 of the present invention, which is composed of a dish-shaped rib part 21a and a rod-shaped core part 21b integrated in the dish-shaped rib part 21a, has a T-shaped cross-section, and the mirror-finished surface 23 is formed at a tip end of the core part 21b so that the mirror-finished surface 23 at the tip end is exposed to the cavity 24. To adopt of the T-shaped ejector pin for the present ejector pin 21 facilitates fixing it in the first half 20a.

The ejector pin 21 is fixed by applying a pressure on the rib part 21a of the ejector pin 21 from the outside of first half 20a via a plate 31. The ejector pin 21 having the mirror-finished surface 23 at the tip end thereof is positioned at a position where the surface of the tip end of the ejector pin coincides with an intermediate surface height of the satin-finished inner surface 22 formed on the upper inner wall surface of cavity 20aa of the first half 20a. It is to be noted that the term "an intermediate surface height of the satin-finished inner surface 22" is equal to an intermediate height between peaks of groove portions and recess portions provided on the satin-finished inner surface 22 which is substantially an uneven surface.

In the third step according to the first embodiment of the present invention, an IC structural body 10 is embedded within a molten resin 51 filled in the cavity 24 after the IC structural body 10 is confined within the cavity.

As shown in FIG. 4, the IC structural body 10 is formed in such a manner that an IC chip 11 which is bonded on an IC chip mounting part 12a of a lead 12 using adhesive 14 and lead parts 12b of the lead 12 are connected with bonding wires 13. These bonding wires 13 are upwardly bent to exist at an upper side of the IC chip 11.

In the third step, the IC structural body 10 and the molten resin 51 are confined within the cavity 24 which are formed in the die 20 by combining the first half 20a and the second half 20b, as shown in FIG. 5. The IC structural body may be positioned at a position where the bonding wires are below the ejector pin. Shape of the satin-finished inner surface 22 and the mirror-finished surface 23 are transferred to a surface of the molten resin 51. Herein, the ejector pin 21 is positioned at a position where a surface of the tip end of the ejector pin having mirror-finished surface 23 coincides with the upper inner wall surface of cavity 20aa of the first half 20a having the satin-finished inner surface. Therefore, the mirror-finished surface 23 used for indicating the "1-pin" position, which is defined by the satin-finished inner surface 22, is stamped on the resin-encapsulated semiconductor package on a single plane.

The above-mentioned method according to the first embodiment of the present invention may include a fourth step of releasing the IC structural body 10 in the cavity 24 from the die after the molten resin solidifies while using a spare pin 41 inserted into a spare-pin-through-hole 42 provided in the first half 20a is projected to the cavity 24 after the IC structural body 10 is embedded within said molten resin 51.

This spare pin 41, which may have a shape similar to a conventional ejector pin, is provided to couple with the spare-pin-through-hole 42 which is provided in the first half die 20a. The spare pin 41 is used for releasing the resin encapsulated semiconductor package from the die 20, so that such a dish-shaped rib part that is provided in the ejector pin 21 is not indispensable for the spare pin 41. In addition, the spare pin 41 is used for releasing the semiconductor package from the die because the ejector pin 21 is fixed to the die and do not have an original function to eject. It is preferable that the spare pin 41 is formed at around a center of the first half 20a.

Figure 10A:
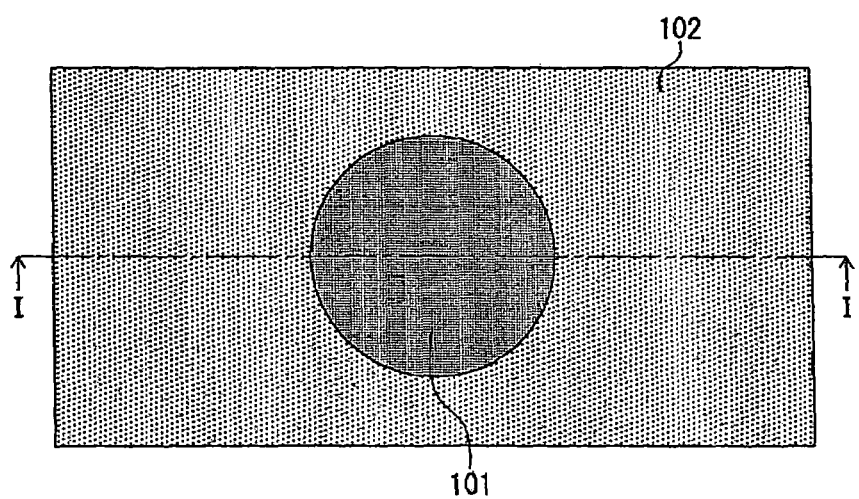
FIG. 10 A is an enlarged plan view showing an indication portion of a "1-pin" position on semiconductor package surface formed by the first embodiment and FIG. 10B is a cross-sectional view of FIG. 10 A taken along line I-I.
Figure 10B:
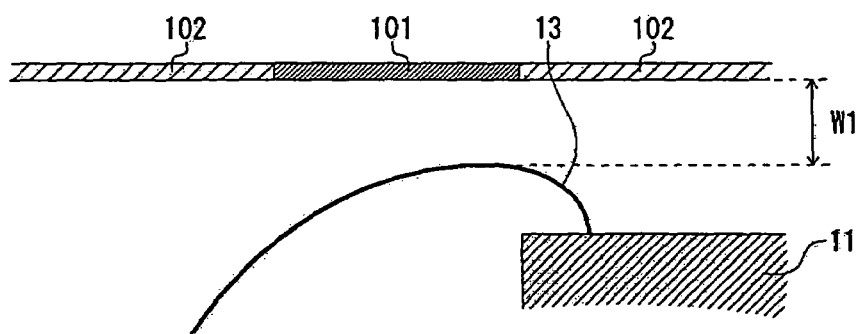
Figure 11A:
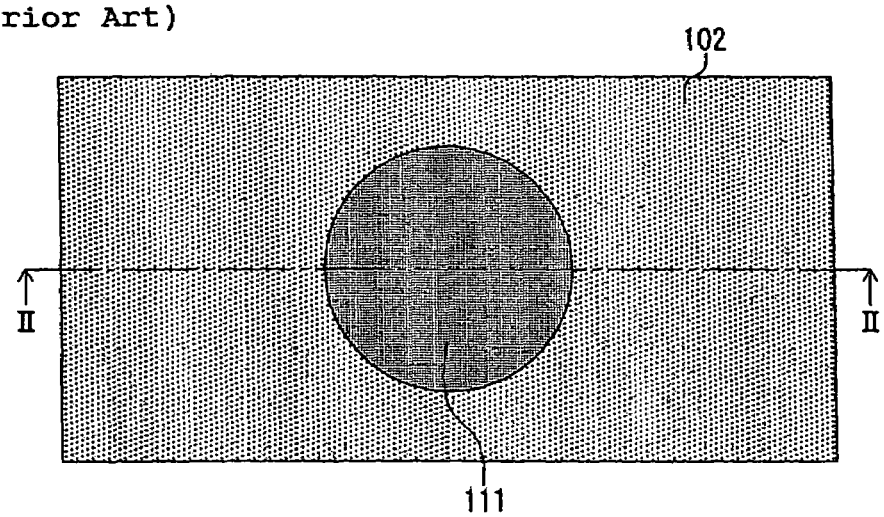
FIG. 11A is an enlarged plan view showing an indication portion of a "1-pin" position using an imprint of ejector pin according to a prior art and FIG. 11B is a cross-sectional view of FIG. 11 A taken along line II-II.
Figure 11B:
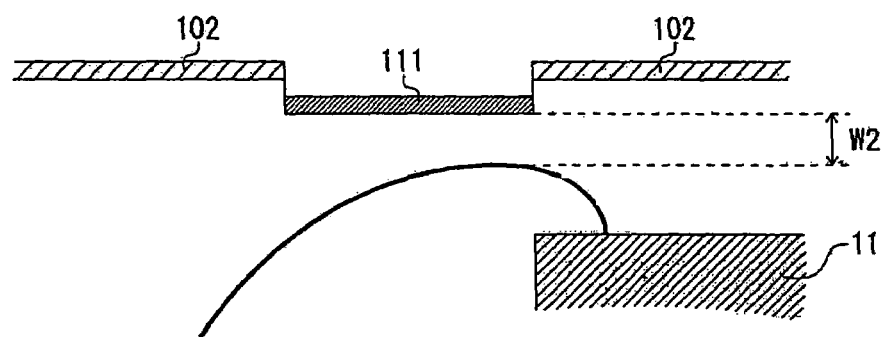

FIG. 10A is an enlarged plan view showing an indication portion of a "1-pin" position of a semiconductor package formed by the first embodiment of the present invention and FIG. 10B is a cross sectional view of the indication portion. FIG. 11A is an enlarged plan sectional view showing an indication portion of "1-pin" position of a semiconductor package by an imprint of an ejector pin and FIG. 11B is a cross sectional view of an indication portion.

The semiconductor package formed by the method according to the first embodiment of the present invention is formed in such a manner that a satin-finished inner surface 102 exists on substantially the same plane as a mirror-finished surface 101 for indicating a "1-pin" position which is surrounded by the satin-finished inner surface 102, as shown in FIG. 10B. On the contrary, in a semiconductor package formed by a conventional method, an indication portion of a 1-pin position 111 is formed as a concave shape, as shown in FIG. 11B. Therefore, the semiconductor package according to the first embodiment of the present invention can keep a larger space between the bonding wires and the indication portion of the package surface than the conventional package can. When the shortest distances between bonding wires and a semiconductor package surface obtained by the present invention and a conventional method are given W1 and W2, respectively, it seems that W1 is larger than W2 as shown in FIG. 10B and FIG. 11B. As a result, such a possibility is reduced that the bonding wires are exposed from the semiconductor package surface to the outside even though semiconductor packages of a thin thickness and a compactness are manufactured.

In regard to the problem that only a mirror-finished surface is rapidly deteriorated when a die is used repeatedly because the mirror-finished surface is likely to be deteriorated in comparison with a satin-finished surface, the die according to the first embodiment of the present invention can be used repeatedly by merely exchanging only an ejector pin having a mirror-finished surface, when the mirror-finished surface is deteriorated. Therefore, when a die is used repeatedly, the die according to the first embodiment of the present invention can reduce costs for mass-production of semiconductor package in comparison with the prior art.

In a second embodiment, a method for manufacturing a semiconductor package having a mark-shaped and mirror-finished surface which is surrounded by a satin-finished inner surface will be described. This method includes first to fourth steps. Each step will be sequentially described from the first step.

Figure 6:
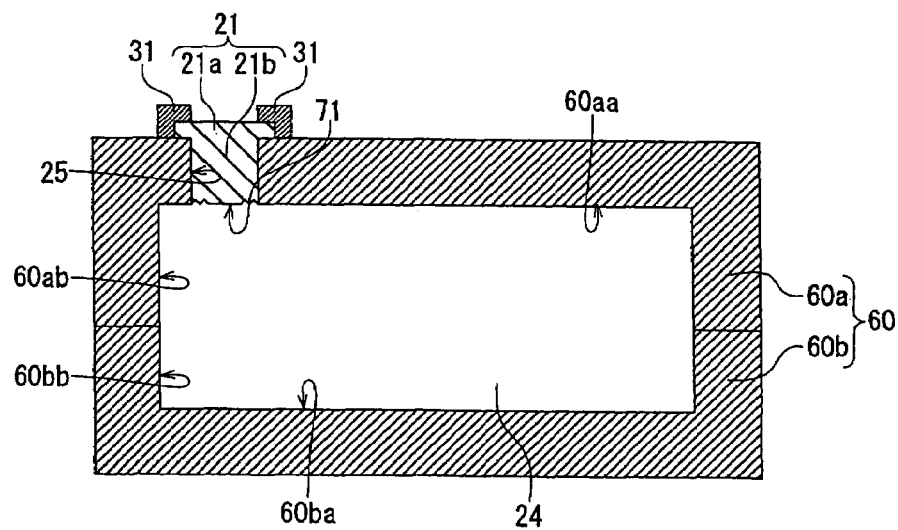
FIG. 6 is a cross sectional view showing a die at a second step according to a second embodiment of the invention.
Figure 7:
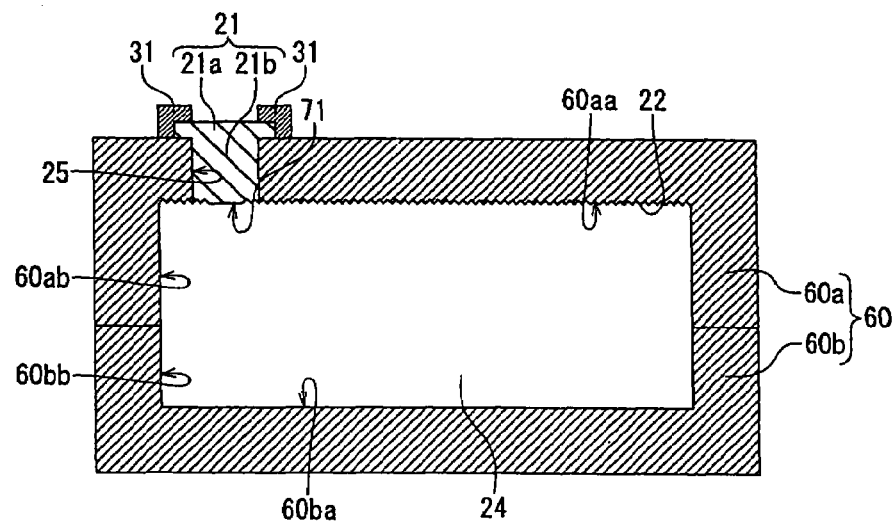
FIG. 7 is a cross-sectional view showing the die at a third step according to the second embodiment of the invention.
Figure 8:
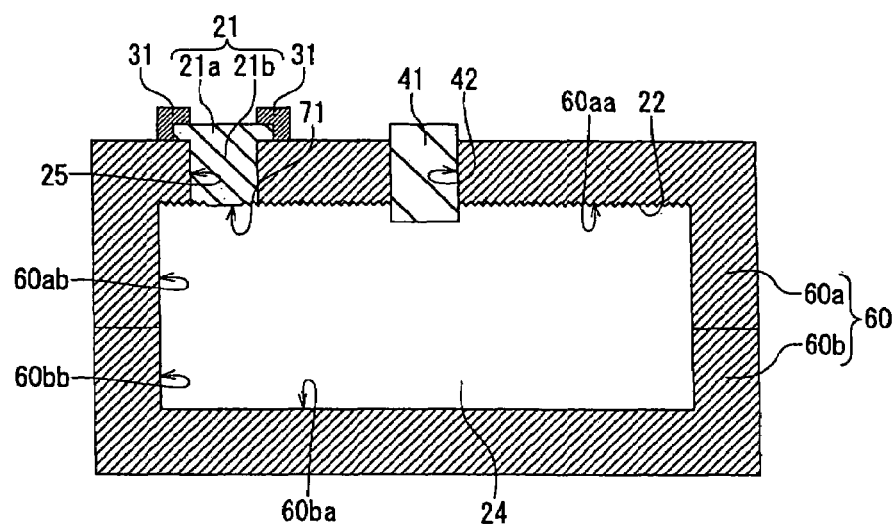
FIG. 8 is a cross-sectional view showing the die with a spare pin inserted therein according to the second embodiment of the invention.
Figure 9:
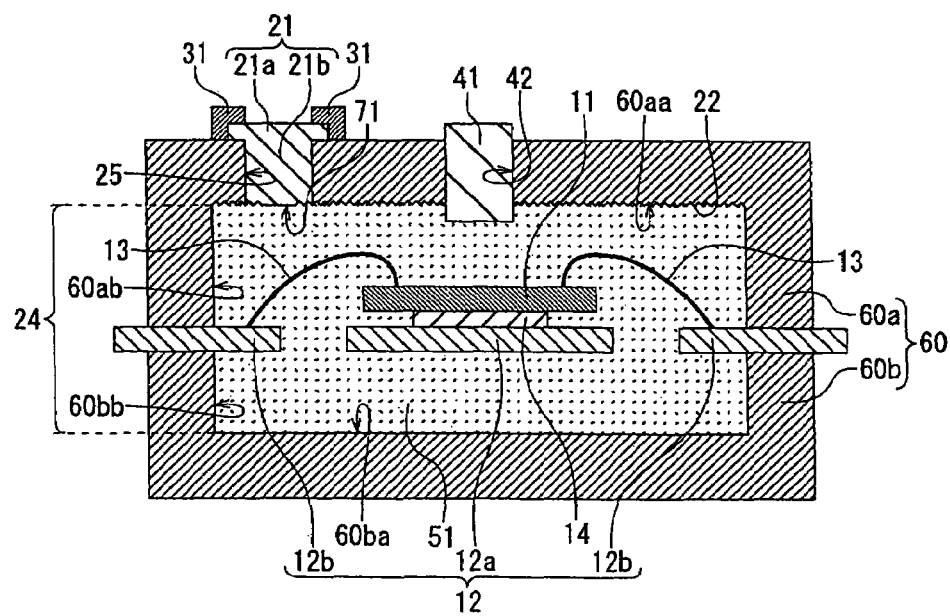
FIG. 9 is a cross-sectional view showing an IC structural body and the die during resin-encapsulation according to the second embodiment of the invention.

FIGS. 6 to 8 are cross-sectional views showing dies used in the first to the third steps according to the second embodiment of the present invention. FIG. 9 is a cross-sectional view of an IC structural body and a die within a resin-encapsulation in the fourth step according to the second embodiment of the present invention.

In the first step according to the second embodiment of the present invention, a die 60 is prepared which includes a first half 60a and a second half 60b coupled together to form a cavity 24 therebetween. It should be noted that the first half 60a and the second half 60b are one or more respectively. The first half has an ejector-pin-though-hole 25 extending therethrough as shown in FIG. 6. It should be noted that the die 60 shown in FIG. 1 is described as an integrated combination of the first half 60a, the second half 60b, and an ejector pin 21. The die 60 consists of the first half 60a and the second half 60b. The first half 60a and the second half 60b, each having an approximate reentrant cross-section and mutually confronting, are provided with an upper inner wall of cavity 60aa, an inner flat plane of second half 60ba, an inner side wall of first half 60ab, and an inner side wall of second half 60bb to form a cavity 24. An IC structural body and a molten resin for encapsulating are confined within the cavity 24 which is formed by coupling the first half 60a and the second half 60b with each other.

In the second step according to the second embodiment of the present invention, an ejector pin 21 is inserted into the ejector-pin-through-hole 25 and positioned at a position where a surface of a tip end of the ejector pin having a mark-shaped and mirror-finished surface 71 coincides with the upper inner wall surface of cavity 60aa as shown in FIG. 7.

The mark-shaped and mirror-finished surface 71 for stamping the mark on a semiconductor package is formed at the tip end of the ejector pin 21.

The mark-shaped and mirror-finished surface 71 is formed by means of a laser irradiation or an electric discharging.

The ejector pin 21 including a dish-shaped rib part 21a and a rod-shaped core part 21b, has a T-shaped cross-section as shown in FIG. 14. In a similar way as the first embodiment of the present invention, the ejector pin 21 is inserted into the ejector-pin-through-hole of the first half 60a while a T-shaped rib part 21a of the ejector pin 21 is pressured from the outside of first half 60a via a plate 31. The ejector pin is positioned at a position where the tip end of the ejector pin 21 is in the same plane as the upper inner wall surface of cavity 60aa.

The third step according to the second embodiment of the present invention will be described while referring to FIG. 7. In this step, a satin-finished inner surface 22 is formed on the upper inner wall surface of cavity 60aa.

In the third step, the tip end of the ejector pin 21 is masked firstly and a satin-finished inner surface 22 is formed on the upper inner wall surface of cavity 60aa by plasma etching. As a result, the satin-finished inner surface 22 can be formed on such a plane where the upper inner wall surface of cavity 60aa is in the same plane as the tip end of the ejector pin 21. In addition, the mark-shaped mirror-finished surface 71, which is defined by the satin-finished inner surface 22, can be formed at the tip end of the ejector pin 21.

In the fourth step according to the first embodiment of the present invention, an IC structural body 10 is embedded with molten resin 51 filled in the cavity after the IC structural body is confined within the cavity as shown in FIG. 9.

As shown in FIG. 4, an IC structural body 10 is formed in such a manner that an IC chip 11 which is bonded on an IC chip mounting part 12a of a lead 12 by using an adhesive 14 and lead parts 12b in the lead 12 are in connection with bonding wires 13. These bonding wires 13 are arcuated above the IC chip to project.

In the fourth step, shape of the satin-finished inner surface 22 and the mark-shaped and mirror-finished surface 71 are transferred to a surface of the molten resin 51. The ejector pin 21 is positioned at a position where the tip end of ejector pin having the mark-shaped and mirror-finished surface 71 surrounded by the satin-finished inner surface 22 is in the same plane as the upper inner wall surface of cavity 60aa of the first half 60a having the satin-finished inner surface 22. Therefore, the mark-shaped and mirror-finished surface, which is defined by the satin-finished inner surface, is formed on the resin-encapsulated semiconductor package surface on the same plane as the satin-finished surface.

The above-mentioned method according to the second embodiment of the present invention may include a fifth step of releasing the IC structural body 10 in the cavity from the die after the molten resin solidifies while using a spare pin 41 inserted into a spare-pin-through-hole 42 provided in the first half 60a is projected to the cavity 24.

This spare pin 41, which may have a shape similar to the conventional ejector pin, is provided to pass through the spare-pin-through-hole 42 which is provided in the first half 60a. The spare pin 41 is used for releasing the resin encapsulated semiconductor package from the die 60, so that the spare pin dose not include such a dish-shaped rib part as the ejector pin 21 to project into the cavity while passing through the first half 60a. In addition, the spare pin 41 is used for releasing the semiconductor package from the die because the ejector pin 21 is fixed into the die and do not have an original function of ejecting. It is preferable that the spare pin 41 is formed at around a center of first half 60a.

Figure 12A:
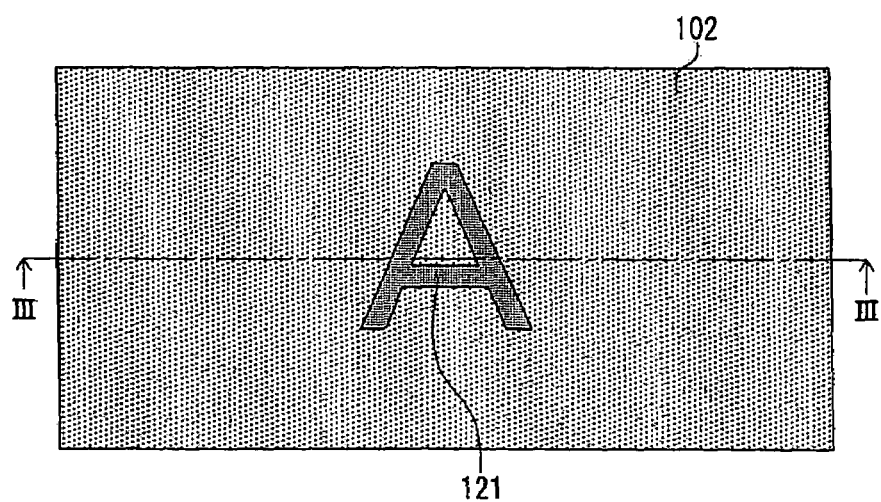
FIG. 12 is an enlarged plan view showing a mark portion stamped on a semiconductor package surface formed by the second embodiment of the present invention and FIG. 12B is a cross-sectional view of FIG. 12 A taken along line III-III.
Figure 12B:
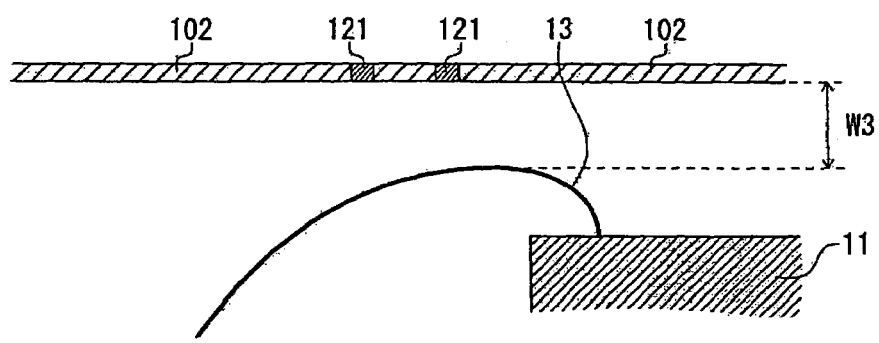
Figure 13A:
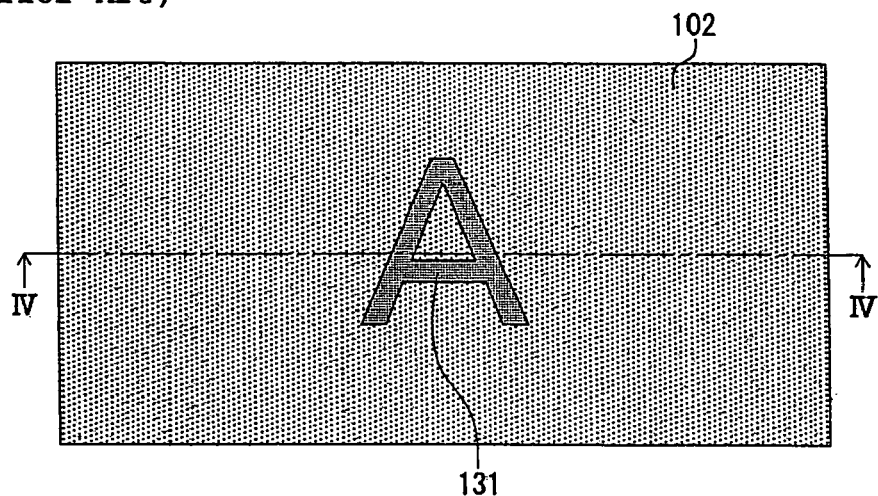
FIG. 13 is an enlarged plan view showing a mark portion stamped on a semiconductor package surface having a mark stamped by use of a laser beam according to a prior art and FIG. 13B is a cross-sectional view of FIG. 13 A taken along line IV-IV.
Figure 13B:
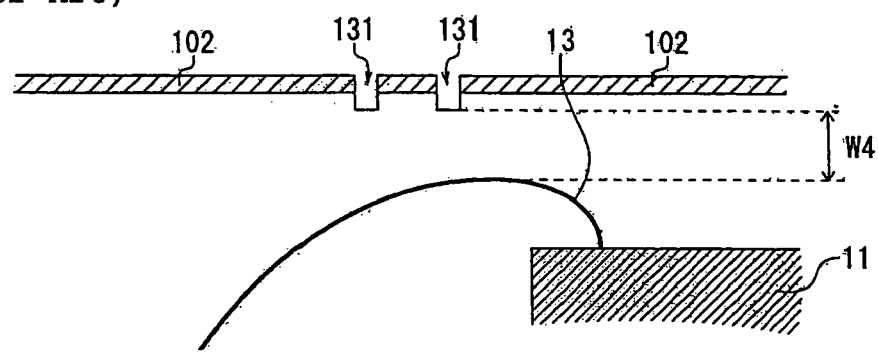

FIG. 12A and FIG. 12B are enlarged plan and cross sectional views showing a mark stamp part according to the second embodiment of the present invention, respectively. FIG. 13A and FIG. 13 B are enlarged plan and cross sectional views showing a mark stamped part formed by means of laser etching according to the conventional art, respectively. In the semiconductor package according to the second embodiment of the present invention, a satin-finished inner surface 102 and a mark-shaped and mirror-finished surface 121 are formed on the same plane. On the other hand, in the semiconductor package formed by the conventional method, a part of an arbitrary shaped stamp 131 is formed as a concave shape. In comparison with a semiconductor package formed using a conventional method, a large spacing between the resin-encapsulated structural body in the package and package surface can be kept in the arbitrary shaped stamped portion. When the shortest distances between bonding wires and a semiconductor package surface obtained by the present invention and a conventional method are given W3 and W4, respectively, it seems that W3 is larger than W4 as shown in FIG. 12B and FIG. 13B. Therefore, such possibilities can be reduced that the resin-encapsulated structural body is exposed from the semiconductor package surface to the outside and that the resin wall cracks at the stamped portion because of an external pressure.

In the prior art, a mark stamped on a semiconductor package is formed after a resin-encapsulation and the semiconductor package is released from a die. To the contrary, according to the second embodiment of the present invention, the mark is stamped at the same time when the resin-encapsulated semiconductor package is embedded with resin in the fourth step. Therefore, the conventional step of stamping the mark after resin-encapsulation and releasing the semiconductor package from the die can be eliminated. The method for manufacturing semiconductor package according to the second embodiment of the present invention has effects of improvement of productivity and reduction of costs in comparison with the conventional art.

As stated above, there arises a problem that only a part of mirror-finished surface is deteriorated firstly when die is used repeatedly because mirror-finished surface is likely to be deteriorated in comparison with a satin-finished inner surface. Since the mirror-finished surface is formed on the ejector pin in the same way as the first embodiment, die can be reused only by exchanging only the ejector pin when a part of mirror-finished surface is deteriorated. Therefore, costs for mass-production of the semiconductor package can be reduced according to the invention even if the die used repeatedly.

The spare pin formed in the first half according to the first and the second embodiments is formed apart from a position above the bonding wires, so that such a possibility can be reduced that the bonding wires are exposed from the semiconductor package to the outside due to the spare pin during the resin-encapsulation.

According to the present invention, there are provided the following dies:

1) A die for manufacturing a semiconductor package including at least one first half having a satin-finished inner surface and an ejector-pin-through-hole, and at least one second half coupled with the first half to form a cavity there between, wherein an ejector pin having a mirror-finished surface at a tip end which is inserted into the ejector-pin-through-hole of the first half and positioned at a position where a surface of the tip end of the ejector pin coincides with an intermediate surface height of the satin-finished inner surface of the first half is provided in the first half.

2) A die for manufacturing a semiconductor package according to 1), wherein the first half is provided with a spare-pin-through-hole and a spare pin inserted into the spare-pin-through-hole to project to the cavity.

3) A die for manufacturing a semiconductor package according to 1), wherein the ejector pin includes a dish-shaped rib part and a rod-shaped core part integrated with the dish-shaped rib part.

4) A die for manufacturing a semiconductor package having a mark-shaped and mirror-finished surface including at least one first half having an ejector-pin-through-hole, and at least one second half coupled with the first half to form a cavity therebetween, wherein a satin-finished inner surface is formed only on an inner surface of the cavity of the first half while an ejector pin having a mark-shaped and mirror-finished surface at a tip end thereof which is inserted into the ejector-pin-through-hole of the first half and positioned at a position where the tip end of the ejector pin coincides with an upper inner wall surface of cavity.

5) A die for manufacturing a semiconductor package according to 4), wherein the first half is provided with a spare-pin-through-hole and a spare pin inserted into the spare-pin-through-hole to project to the cavity.

6) A die for manufacturing a semiconductor package according to 4), wherein the ejector pin includes of a dish-shaped rib part and a rod-shaped core part integrated with the dish-shaped rib part.

This application is based on Japanese Patent Application No. 2005-263516 which is hereby incorporated by reference.

What is claimed is:

1. A method for manufacturing a semiconductor package, comprising:
    preparing a die provided with at least one first half and at least one second half coupled together to form a cavity therebetween, said first half having a satin-finished inner surface and an ejector-pin-through-hole extending therethrough,
    inserting an ejector pin having a mirror-finished surface at a tip end thereof into said ejector-pin-through-hole, positioning said ejector pin at a position where a surface of said tip end of said ejector pin coincides with an intermediate surface height of said satin-finished inner surface of said first half, and fixing said ejector pin at said position, and
    embedding an IC structural body having a lead, an IC chip, and bonding wires bonded between the lead and the IC chip within a molten resin filled in said cavity, after said IC structural body is confined within said cavity.

2. A method for manufacturing a semiconductor package according to claim 1, wherein during said embedding, said IC structural body is positioned at a position where said bonding wires are below said ejector pin.

3. A method for manufacturing a semiconductor package comprising:
    preparing a die provided with at least one first half and at least one second half coupled together to form a cavity therebetween, said first half having a satin-finished inner surface and an ejector-pin-through-hole extending therethrough,
    inserting an ejector pin having a mirror-finished surface at a tip end thereof into said ejector-pin-through-hole, positioning said ejector pin at a position where a surface of said tip end of said ejector pin coincides with an intermediate surface height of said satin-finished inner surface of said first half,
    embedding an IC structural body having a lead, an IC chip, and bonding wires bonded between the lead and the IC chip within a molten resin filled in said cavity, after said IC structural body is confined within said cavity, and
    releasing said IC structural body in said cavity from said die after said molten resin solidifies, using a spare pin inserted into a spare-pin-through-hole provided in said first half to project into said cavity.

4. A method for manufacturing a semiconductor package according to claim 1, wherein said ejector pin includes a dish-shaped rib part and a rod-shaped core part integrated with said dish-shaped rib part, said mirror-finished surface on a tip end of said rod-shaped core part.

5. A method for manufacturing a semiconductor package having a mark-shaped and mirror-finished surface comprising:
    preparing a die provided with at least one first half having an ejector-pin-through-hole extending therethrough and at least one second half coupled together with said first half to form a cavity therebetween,
    inserting an elector pin having a mark-shaped and mirror-finished surface at a tip end thereof into said ejector-pin-through-hole, positioning said ejector pin at a position where the tip end of said ejector pin is substantially on a same plane as an upper inner wall surface of the cavity of said first half, and fixing said ejector pin at said position,
    forming a satin-finished inner surface only on said upper inner wall surface of the cavity of said first half, and
    embedding an IC structural body having a lead, an IC chip, and bonding wires bonded between the lead and the IC chip within a molten resin filled in said cavity, after said IC structural body is confined within said cavity.

6. A method for manufacturing a semiconductor package according to claim 5, wherein during said embedding, said IC structural body is positioned at a position where the bonding wires are below said ejector pin.

7. A method for manufacturing a semiconductor package having a mark-shaped and mirror finished surface comprising:
    preparing a die provided with at least one first half having an ejector-pin-through-hole extending therethrough and at least one second half coupled together with said first half to form a cavity therebetween,
    inserting an ejector pin having a mark-shaped and mirror-finished surface at a tip end thereof into said ejector-pin-through-hole, positioning said ejector pin at a position where the tip end of said ejector pin is substantially on a same plane as an upper inner wall surface of the cavity of said first half, forming a satin-finished inner surface only on said upper inner wall surface of the cavity of said first half, embedding an IC structural body having a lead, an IC chip, and bonding wires bonded between the lead and the IC chip within a molten resin filled in said cavity, after said IC structural body is confined within said cavity, and releasing said IC structural body in said cavity from said die after said molten resin solidifies, using a spare pin inserted into a spare-pin-through-hole provided in said first half to project into said cavity.

8. A method of manufacturing a semiconductor package according to claim 5, wherein said ejector pin includes a dish-shaped rib part and a rod-shaped core part integrated with said dish-shaped rib part, said mirror-finished surface is on a tip end of said rod-shaped core part.

9. A method for manufacturing a semiconductor package according to claim 3, wherein during said embedding, said IC structural body is positioned at a position where said bonding wires are below said ejector pin.

10. A method for manufacturing a semiconductor package according to claim 3, wherein said ejector pin includes a dish-shaped rib part and a rod-shaped core part integrated with said dish-shaped rib part.

11. A method for manufacturing a semiconductor package according to claim 7, wherein during said embedding, said IC structural body is positioned at a position where the bonding wires are below said ejector pin.

12. A method for manufacturing a semiconductor package according to claim 7, wherein said ejector pin includes a dish-shaped rib part and a rod-shaped core part integrated with said dish-shaped rib part.

* * * * *